United States Patent
Kwon

(10) Patent No.: US 8,238,176 B2
(45) Date of Patent: Aug. 7, 2012

(54) I/O CIRCUIT WITH PHASE MIXER FOR SLEW RATE CONTROL

(75) Inventor: Chang-Ki Kwon, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 12/833,744

(22) Filed: Jul. 9, 2010

(65) Prior Publication Data

US 2010/0271070 A1    Oct. 28, 2010

Related U.S. Application Data

(62) Division of application No. 12/041,268, filed on Mar. 3, 2008, now Pat. No. 7,764,554.

(51) Int. Cl.
*G11C 7/00* (2006.01)

(52) U.S. Cl. .......... 365/194; 365/191; 365/189.05; 365/189.17; 365/210.11

(58) Field of Classification Search .......... 365/191, 365/194, 189.05, 189.17, 210.11
See application file for complete search history.

(56) References Cited

U.S. PATENT DOCUMENTS

| 6,356,106 | B1 | 3/2002 | Greeff et al. ............... 326/30 |
| 7,282,968 | B2 * | 10/2007 | Lee ............... 327/112 |
| 7,317,328 | B2 * | 1/2008 | Kim ............... 326/30 |
| 2003/0042953 | A1 * | 3/2003 | Shin ............... 327/170 |
| 2008/0056415 | A1 | 3/2008 | Chang et al. ............... 375/349 |
| 2009/0116602 | A1 | 5/2009 | Kwon et al. ............... 375/372 |

OTHER PUBLICATIONS

Brox, M. Fibranz et al., "*A 2Gb/s/pin 512Mb Graphics DRAM with NoiseReduction Techniques*", IEEE International, Solid State Circuits Conference, Feb. 2006, 1 page abstract.
Fujisawa, H. Nakamura et al., "*1.8-V 800-Mb/s/pin DDR2 and 2.5-V 400-Mb/s/pin DDR1 compatibly designed 1 Gb SDRAM with dual clock input latch scheme and hybrid multi-oxide output buffer*", IEEE, Symposium on VLSI Circuits, Jun. 2004, 1 page abstract.

* cited by examiner

*Primary Examiner* — Hoai V Ho
(74) *Attorney, Agent, or Firm* — Dorsey & Whitney LLP

(57) ABSTRACT

An apparatus includes a terminal, a first plurality of driver lines, and a first phase mixer. The driver lines drive the terminal to a first logic state responsive to a first enable signal. The first phase mixer is coupled to a first one of the first plurality of driver lines. The first phase mixer is operable to receive the first enable signal and a first delayed enable signal derived from the first enable signal and generate a first signal on the first driver line having a first configurable delay with respect to the first enable signal by mixing the first enable signal and the first delayed enable signal.

20 Claims, 3 Drawing Sheets

I/O CIRCUIT WITH PHASE MIXER FOR SLEW RATE CONTROL

CROSS REFERENCE TO RELATED APPLICATION

This application is a divisional of U.S. patent application Ser. No. 12/041,268, filed Mar. 3, 2008, and issued as U.S. Pat. No. 7,764,554 on Jul. 10, 2010. This application and patent are incorporated herein by reference, in their entirety, for any purpose.

TECHNICAL FIELD

Embodiments of the disclosed subject matter relate generally to timing control of integrated circuit devices and, more particularly, to an 110 circuit including a phase mixer for slew rate control.

Modern integrated circuit devices are comprised of millions of semiconductor devices, e.g., transistors, formed above a semiconductor substrate, such as silicon. These devices are very densely packed, i.e., there is little space between them. Similarly, densely packed electrically conducting lines may also be formed on the semiconductor substrate. By forming selected electrical connections between selected semiconductor devices and selected conducting lines, circuits capable of performing complex functions may be created. For example, bits of data may be stored by providing electrical current to a plurality of bit lines and an orthogonal plurality of word lines that may be electrically coupled to one or more capacitors in a semiconductor memory.

Semiconductor memory devices are one type of integrated circuit device that has been widely used to enhance the performance of computer systems, especially when executing memory intensive applications. Semiconductor memory devices typically include an array of memory cells, address decoding circuitry for selecting one of or a group of the memory cells for reading or writing data, sensing circuitry for detecting the digital state of the selected memory cell(s), and input/output lines to receive the sensed data and convey that information for eventual output from the semiconductor memory. Synchronous memory devices receive and deliver data coincident with a clock signal. Typically, an external clock signal is received by the device. Input signals and data are received synchronized with the external clock signal. Due to internal delays associated with the components of the memory device, the phase of the external clock signal is shifted within the memory device. Timing control circuits, such as delay-locked loops (DLLs) or phase locked loops (PLLs), may be provided for synchronizing the output signals and the output strobe signals with the provided external clock signal.

Another aspect of timing control relates to controlling the rate at which the values of the outputs change during transitions from one logic state to another. This rate of change, commonly referred to a slew rate, is typically the subject of one or more performance specifications for a memory device. Common output driver circuits employ a plurality of individual driver lines that each feed each individual output pad or pin. For example, a driver output circuit may have 4, 8, or 16 driver lines per output line, also referred to as a DQ line. The timing arrangement for firing the individual driver lines affects the net slew rate for the output line. By delaying one line with respect to another the slew rate may be decreased. Typically, such timing control is done by adding inverter delays to the output path. The final timing configuration is typically static. A limitation of this type of timing control is that only a relatively coarse level of timing control is achievable. Because the logic level cannot be changed, a pair of inverters must be used for each time delay element. Hence, the smallest delay that can be imposed is typically two inverter delays. This aspect of timing control can also be applied to controlling the slew rate associated with turning on or off on-die termination (ODT) circuits to improve signal integrity during the receipt of input data on the DQ lines.

BRIEF DESCRIPTION OF THE SEVERAL VIEWS OF THE DRAWINGS

The embodiments of the disclosed subject matter will hereafter be described with reference to the accompanying drawings, wherein like reference numerals denote like elements, and.

DETAILED DESCRIPTION OF EMBODIMENTS OF THE INVENTION

Figure 1:
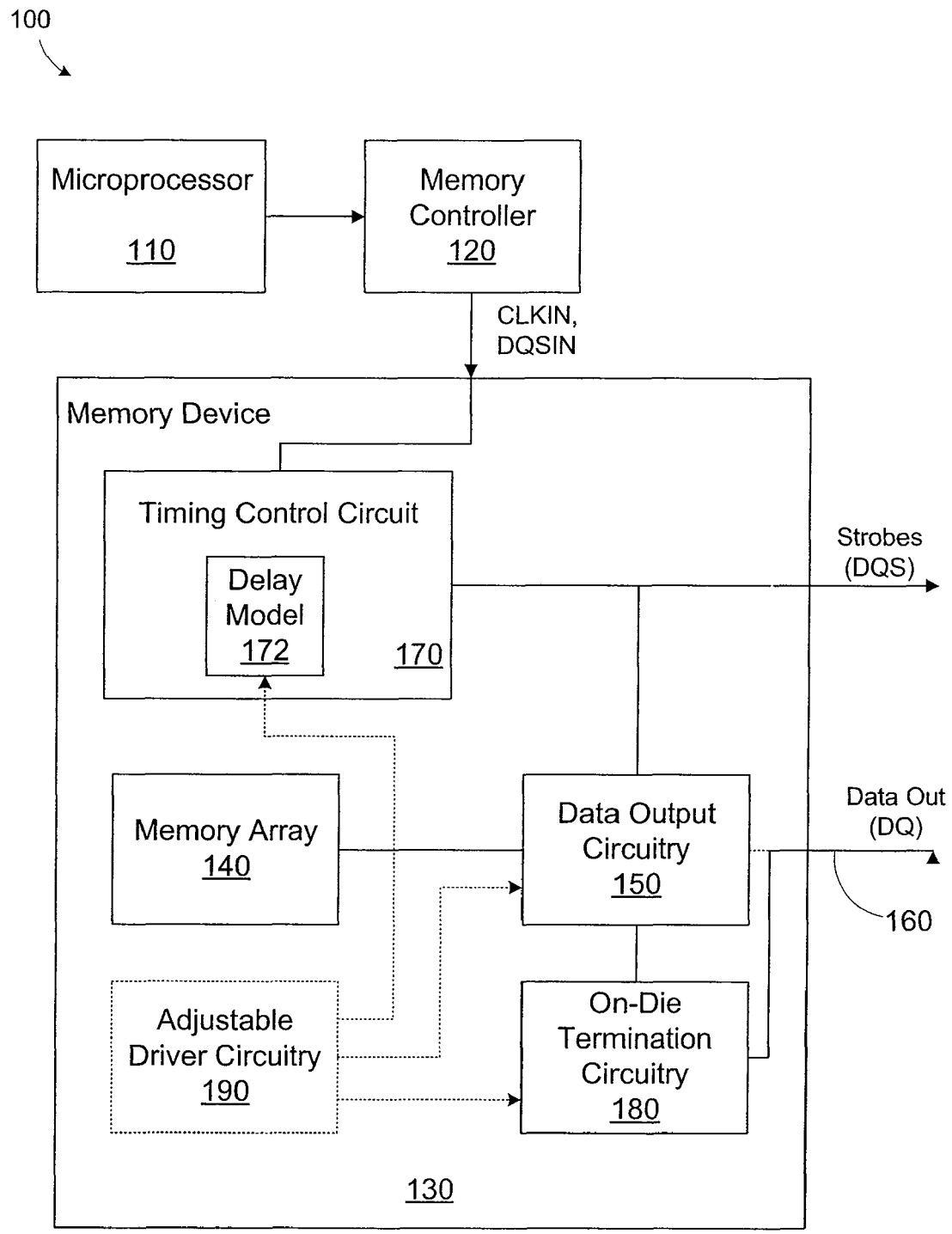
FIG. 1 is a simplified block diagram of a computer system.

One or more specific embodiments of the disclosed subject matter are described below. It is specifically intended that the disclosed subject matter not be limited to the embodiments and illustrations contained herein, but include modified forms of those embodiments including portions of the embodiments and combinations of elements of different embodiments as come within the scope of the following claims.

Embodiments of the disclosed subject matter are described with reference to the attached figures. Various structures, systems and devices are schematically depicted in the drawings for purposes of explanation only and so as to not obscure the embodiments of the disclosed subject matter with details that are well known to those skilled in the art. Nevertheless, the attached drawings are included to describe and explain illustrative examples of embodiments of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Nothing in this application is considered critical or essential to the disclosed subject matter unless explicitly indicated as being "critical" or "essential."

Referring now to the drawings wherein like reference numbers correspond to similar components throughout the several views and, specifically, referring to FIG. 1, embodiments of the disclosed subject matter shall be described in the context of a simplified block diagram of a computer system 100. The computer system 100 includes a microprocessor 110 coupled to a memory controller 120. The memory controller 120 is coupled to a memory device 130. The microprocessor 110 issues commands to the memory controller 120 to access data stored in the memory device 130. For clarity and to avoid obscuring the instant invention, only those interconnections and modules related to the control of the timing in the memory device 130 are illustrated. The memory device 130 includes a memory array 140 for storing data and data output circuitry 150 for outputting data read from the memory array 140 on a data output path 160.

The memory controller 120 provides the input clock signal (CLKIN) and input strobes (DQSIN) to the memory device 130. A timing control circuit 170 receives the input clock signal and generates the output strobes (DQSOUT) For typical memory systems, the DQSIN and DQSOUT signals can be transferred in different time through the same bidirectional DQS line. For a high-speed memory interface, the may be separated into unidirectional DQS lines. The timing control circuit 170 may be implemented using a variety of circuit types, such as closed loop timing circuits (e.g., delay locked loop, phase locked loop), open loop timing circuits (e.g., measure control delay), or a combination of both (e.g., an MCD loop embedded within a DLL loop). Generally, the timing control circuit 170 employs a delay model 172 of the data output circuitry 150 for establishing the timing control. Those of ordinary skill in the art are familiar with timing control circuitry for synchronizing the CLKIN and DQS/DQ signals, including the use of the delay model 172, so the details of such a circuit are not described in greater detail herein.

The memory device 130 may also include on-die termination (ODT) circuitry 180 for driving the DQ terminal 160 to a known state to prevent distortion of data caused by signal reflection during normal operation (such as a read/write operation) of the memory device 130.

The microprocessor 110, memory controller 120, and memory device 130 may take on numerous forms, depending on the particular implementation. Those of ordinary skill in the art are knowledgeable regarding the particular construct and operation of these devices.

As will be described in greater detail below in reference to FIG. 2, the memory device 130 includes adjustable driver circuitry 190 that includes phase mixer circuitry to allow fine resolution control of the slew rate exhibited on the output of the adjustable driver circuitry 190. As will be described below, the adjustable driver circuitry 190 may be implemented in the data output circuitry 150, the ODT circuitry 180, and/or the delay model 172.

Figure 2:
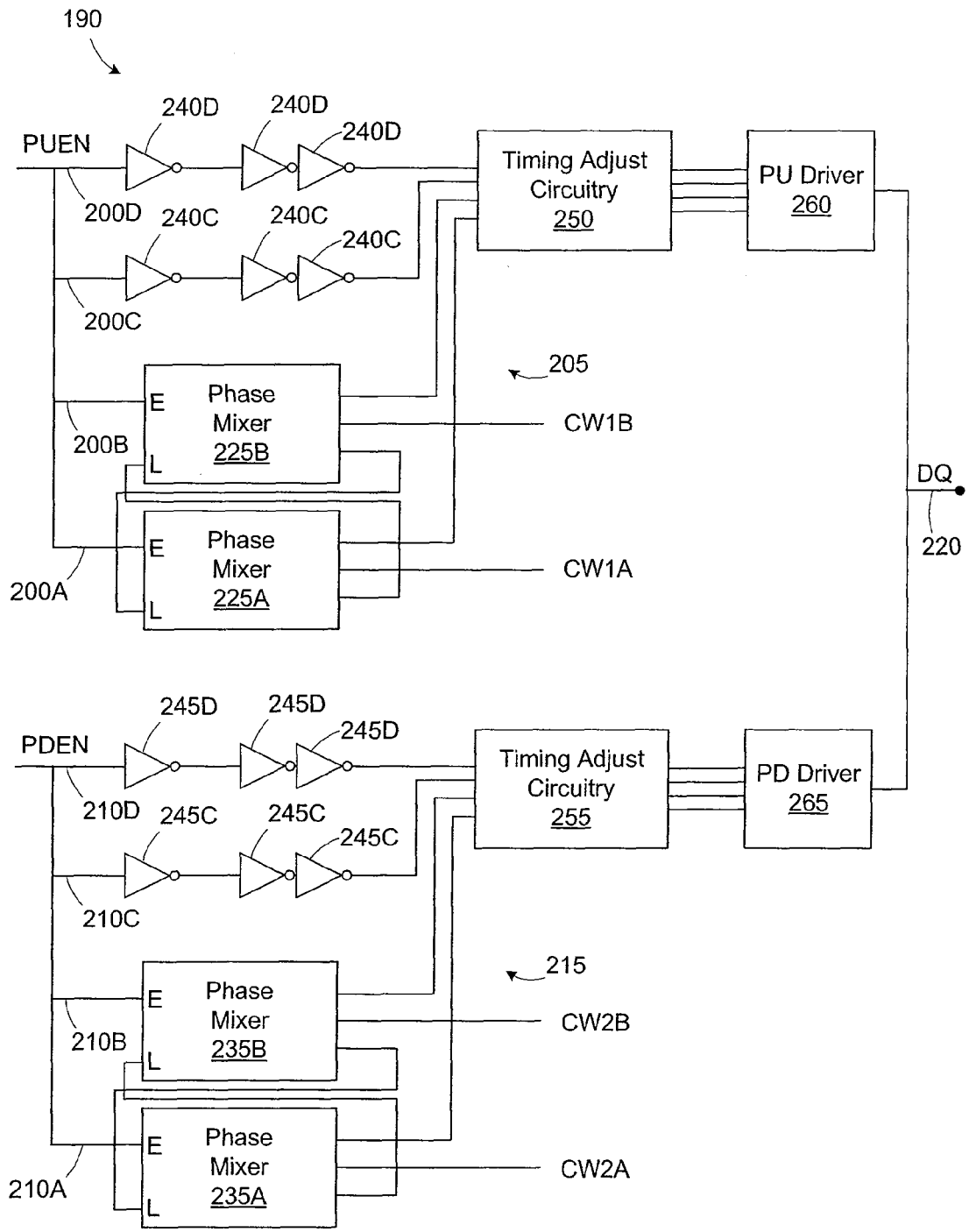
FIG. 2 is a simplified block diagram of data output circuitry in a memory device of the system of FIG. 1.

Turning now to FIG. 2, a simplified block diagram of the adjustable driver circuitry 190 is illustrated. In the following description lettered suffixes are added in some cases to denote similar elements. Reference to a particular element is denoted by the use of the particular letter suffix, while reference to the collective group of similar elements is denoted by the use of the numeral without a letter suffix. For purposes of the following illustration, the adjustable driver circuitry 190 is shown having four driver lines 200A, 200B, 200C, 200D on a pull-up path 205 and four driver lines 210A, 210B, 210C, 210D on a pull-down path 215 for an individual DQ line 220. In FIG. 2, only the circuitry associated with the single DQ line 220 is shown. In the case where the adjustable driver circuitry 190 is implemented in the data output circuitry 150 or the ODT circuitry 180, the circuitry 190 would be repeated for each DQ line 220 of the memory device 130. Moreover, the number of driver lines 200, 210 may also vary (e.g., 2, 3, 7, 8, etc.) depending on the particular implementation.

In the illustrated embodiment, two of the driver lines 200A, 200B from the pull-up path 205 and two of the driver lines 210A, 210B from the pull-down path 215 are routed to phase mixers 225A, 225B, 235A, 235B, respectively. As will be described in greater detail below, the phase mixers 225A, 225B, 235A, 235B allow fine resolution control of the timing of the associated driver lines 200A, 200B, 210A, 210B. The configuration of the phase mixers 225A, 225B with respect to the amount of delay imposed is configured using control words CW1A, CW1B, respectively. Similarly, the configuration of the phase mixers 235A, 235B with respect to the amount of delay imposed is configured using control words CW2A, CW2B, respectively. By setting various values for the control words, the relative timing of the driver lines 200, 210 may be modified, thereby allowing control of the slew rate for the DQ line 220.

In the illustrated embodiment, the driver lines 200C, 200D, 210C, 210D are illustrated as not having associated phase mixers. In this configuration, the timing of the driver lines 200C, 200D, 210C, 210D is controlled in the conventional fashion. The driver lines 200C, 200D, 210C, 210D are routed to buffers 240C, 240D, 245C, 245D. Timing adjust circuitry 250, 255 is provided for making coarse timing adjustments to the driver line signals. The outputs of the timing adjust circuitry 250, 255 are provided to a pull-up driver 260 and a pull-down driver 265, respectively. The timing adjust circuitry 250, 255 may be configured to introduce variable delays (e.g., based on inverter delays) to the driver lines 200, 210 as is done with conventional driver circuits. The fine resolution timing control provided by the phase mixers 225, 235 allows fine adjustments to be made to the slew rate seen at the DQ line 220. Although only two driver lines 200A, 200B, 210A, 210B for each path 205, 215 are illustrated, it is contemplated that in some embodiments the number of driver lines 200, 210 with associated phase mixer delay control may be more or less. For example, in an embodiment with 8 driver lines 200, 210, additional phase mixers 225, 235 may be provided. For another example with additional ODT driver lines that look similar to the output driver lines 200, 210, additional phase mixers may be further provided in an embodiment where the ODT driver lines are embedded in the output driver lines.

Each phase mixer 225, 235 receives an early signal (i.e., DQout or DQSout), denoted by the "E" input, and a late signal (i.e., DQout or DQSout), denoted by the "L" input. The early signal for the pull-up phase mixers 225A, 225B is generated by a pull-up enable signal (PUEN) indicating that the DQ line 220 should be driven at a logically high state, and the early signal for the pull-down phase mixers 235A, 235B is generated by a pull-down enable signal (PDEN) indicating that the DQ line 220 should be driven at a logically low state. In the illustrated embodiment, the late signal for the phase mixer "A" phase mixers 225A, 235A is generated by the "B" phase mixers 225B, 235B, and vice versa.

Using the phase mixers 225, 235 to generate the late signals obviates the need to generate the late signals externally, thereby reducing real estate requirements for the adjustable driver circuitry 190. Alternatively, additional circuitry may be provided that receives the PUEN and/or PDEN signals and generates a delayed version of those signals for the late signal. Because, the early signal is used to ultimately generate the late signal, one of the phase mixers in each group is configured to select only the early signal for controlling the timing of its associated driver line 200, 210. For example, the phase mixer 225A may be configured using the control word CW1A to select the early signal (i.e., the PUEN signal). Once, the first edge seen on the PUEN signal propagates through the phase mixer 225A, the late signal is generated for the phase mixer 225B. The control word CW1B of the phase mixer 225B may then be set such that the output clock generated has a phase that lies somewhere between the phase of the early signal and the late signal. Hence, the signal on the driver line 200B would be delayed with respect to the signal on the driver line 200A. The relative order in which the driver lines activate may be reversed by setting the phase mixer 225B to select the early signal and setting the phase mixer 225A to generate the phase-mixed late signal.

Due to process variance, each driver line 200, 210 may have a slightly different characteristic impedance. By controlling the order in which the driver lines 200, 210 fire using the timing adjust circuitry 250, 255 and the phase mixers 225, 235, the dynamic impedance of the DQ line 220 may be set, thereby controlling the slew rate of the DQ line 220.

Figure 3:
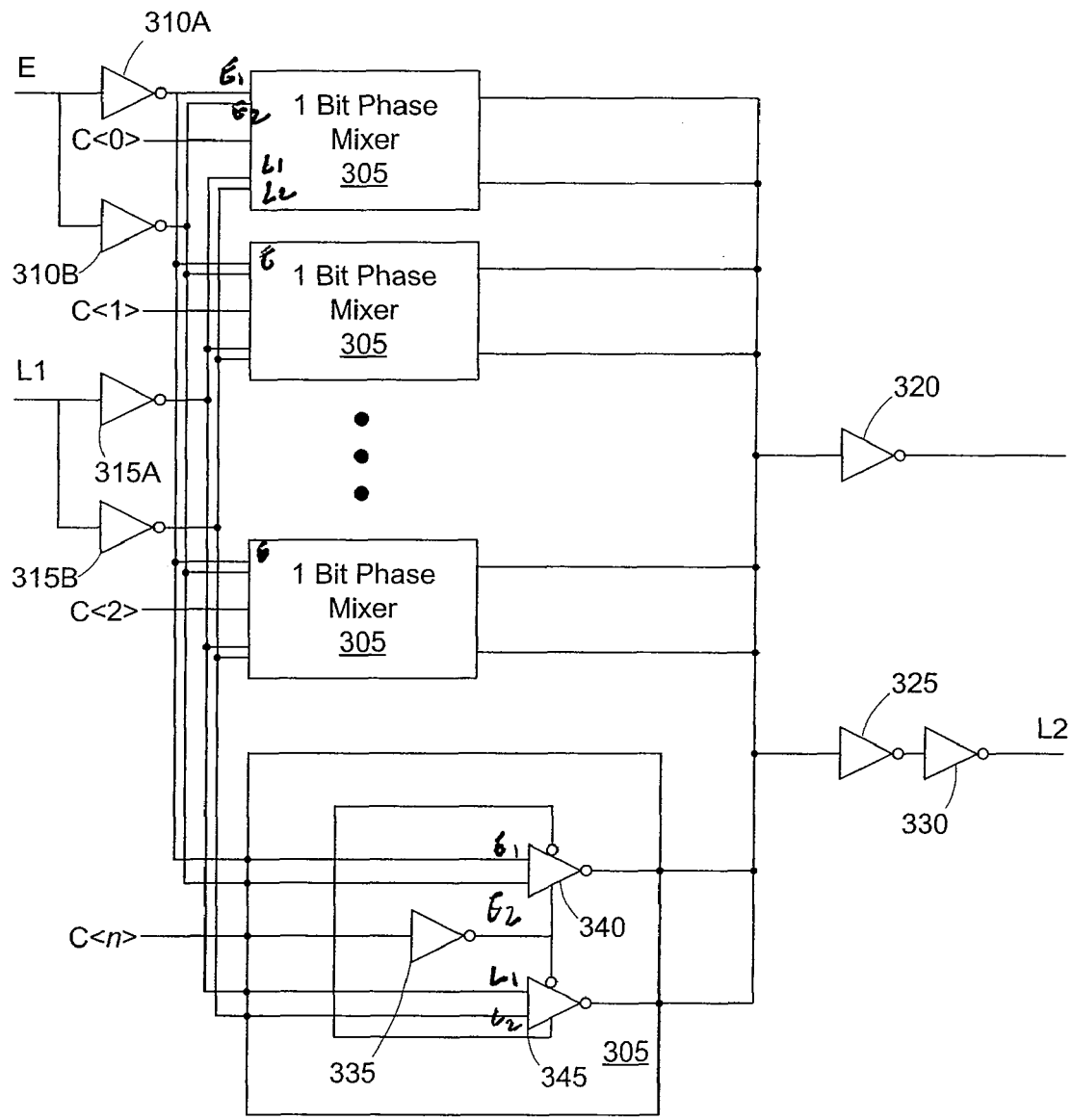
FIG. 3 is a simplified circuit diagram of a phase mixer in the data output circuitry of FIG. 2.

Turning now to FIG. 3, a simplified diagram of a phase mixer 300 suitable for use as one of the phase mixers 225, 235 in the adjustable driver circuitry 190 is shown. An exemplary phase mixer is described in U.S. Pat. No. application Ser. No. 11/983,201, entitled "High Speed Wide Frequency-Range Digital Phase Mixer", filed on Nov. 7, 2007, assigned to the assignee of the present application, and incorporated herein by reference in its entirety.

In the illustrated embodiment, the phase mixer 300 is an n-bit phase mixer. The number of stages 305 of the phase mixer 300 corresponds to the number of bits in the control word (e.g., CW1A, CW1B, CW2A, CW2B in FIG. 2). The number of stages 305 may vary depending on the particular implementation and the granularity of the control required for the phase mixer 300. The number of stages determines the number of steps that may be provided in the output signal. If the control word is set to "00 . . . 000", the early signal is selected by each stage 305. Contrastingly, if the control word is set to "11 . . . 111", the late signal is selected. Values in between provide incremental delay values between the early signal and the late signal. Hence, the amount of delay imposed is a function of the number of stages 305 for which the control bit is set to "1". Of course complimentary logic may be employed such that "1" corresponds to a late signal selection and "0" corresponds to an early signal selection.

The phase mixer 300 includes input buffers 310A, 310B for receiving the early signal and input buffers 315A, 315B for receiving the late signal. The outputs of each stage 305 are provided to output buffers 320, 325. The output buffer 320 provides the delayed signal for the driver line 200, 210, and the output buffer 325 provides the late signal for the associated phase mixer, as illustrated in FIG. 2. An additional inverting buffer 330 is coupled to the output buffer 325 for the late signal to provide an even number of inversions so that the late signal is not inverted with respect to the early signal. Again, the arrangement where the late signal is generated using the output of the phase mixer 300 may not be required in some embodiments. The late signal may be received from a different source.

Each stage 305 includes an enable buffer 335 that selects one of buffer 340 or buffer 345 for providing the output of the stage 305. The buffer 340 is coupled to the buffers 310A, 310B for receiving the early signal, and the buffer 345 is coupled to the buffers 315A, 315B for receiving the late signal. The enable buffer 335 is coupled to receive a bit of the control word, c<0 . . . n>. The enable buffer 335 enables the buffer 340 responsive to the associated control bit being "0", thereby selecting the early signal, and enables the buffer 345 responsive to the control bit being "1", thereby selecting the late signal.

The input signal received by the output buffer 320 is thus the sum of the early or late signal selections configured for each stage 305. By setting the control bits, the net slew rate of the DQ line 220 in FIG. 2 may be controlled. The configuration of the control bits for setting the timing relationships of the driver lines 200, 210 may be static or dynamic. In a static arrangement, the control words may be set by fusible elements during a configuration process that compensates for process variation within the memory device 130. In a dynamic arrangement, the slew rate of the DQ line 220 may be controlled using a PLL or DLL circuit that automatically adjusts the values of the control words to affect change in the slew rate.

In the case where the memory device 130 includes a timing control circuit 170 employing a delay model 172 for synchronizing the DQ and DQS with a reference input clock signal, the delay model 172 is configured to be consistent with the characteristics of the data output circuitry 150 employing phase mixers 300. As described above in reference to FIG. 1, the data output path 160 is typically not included in the control loop used for clock synchronization, but rather the delay associated with the output path 160 is modeled. In one embodiment where the configuration of the data output circuitry 150 is static with respect to the determination of the control words, the delay model 172 may be also configured statically. However, in another embodiment that employs dynamic control of the data output circuitry 150 slew rate characteristics, the delay model 172 may also be provided with phase mixers 300 for dynamically modeling the delay. In the delay model 172, the timing of each driver line 200, 210 may be modeled individually. For those driver lines 200C, 200D, 210C, 210D without phase mixer control, a static model may be used. For the driver lines 200A, 200B, 210A, 210B with phase mixers 225, 235, duplicate phase mixers may also be provided that are configured in accordance with the same control words as the phase mixers 225, 235 in the data output circuitry 150. Hence, if the timing is changed in one of the data output circuitry 150 elements, a corresponding change may also be made in the delay model 172 using the duplicate circuitry.

In the embodiment, where the adjustable driver circuitry 190 is used in the ODT circuitry 180, the adjustable driver circuitry 190 operates similarly to how it operates with the data output circuitry 150, with the exception of the enable signals. In the case where the adjustable driver circuitry 190 is used in the data output circuitry 150, the logic levels of the PUEN signal and the PDEN signals correspond to the desired logic level of the output at the DQ terminal 220. For example, when a logic "1" is the desired output, the PUEN and PDEN signals are both at a logic "1", and conversely, when a logic "0" is the desired output, the PUEN and PDEN signals are both at a logic "0".

The logic levels for the control of the adjustable driver circuitry 190 in the ODT circuitry 180 depends on the ODT scheme used. There are three typical ODT schemes, VDDQ terminated ODT, ground terminated ODT, and center-tapped ODT depending on the desired state of the terminal 220 when the ODT circuitry 180 is enabled. In VDDQ terminated ODT the DQ terminal 220 is taken to the same logic level as VDDQ. In ground terminated ODT the DQ terminal 220 is grounded. In center-tapped ODT, the DQ terminal 220 is taken to a level approximately equal to half of VDDQ. The different combinations of PUEN and PDEN determine the ODT state. If In VDDQ terminated ODT, PUEN is "1" and PDEN is "1". In ground terminated ODT, PUEN is "0" and PDEN is "0". In center-tapped ODT, PUEN is "1" and PDEN is "0".

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

I claim:

1. An apparatus, comprising:
   a terminal; and
   a pull-up path coupled to the terminal, the pull-up path including:
      a plurality of pull-up driver lines for driving the terminal to a first logic state responsive to a pull-up enable signal;
      a plurality of pull-up phase mixers coupled to at least a first subset of the pull-up driver lines, each pull-up phase mixer being operable to receive the pull-up enable signal and a delayed pull-up enable signal derived from the pull-up enable signal and generate a signal on the associated pull-up driver line having a first configurable delay with respect to the pull-up enable signal by mixing the pull-up enable signal and the delayed pull-up enable signal; and
   a pull-down path coupled to the terminal, the pull-down path including:
      a plurality of pull-down driver lines for driving the terminal to a first logic state responsive to a pull-down enable signal; and
      a plurality of pull-down phase mixers coupled to at least a second subset of the pull-down driver lines, each pull-down phase mixer being operable to receive the pull-down enable signal and a delayed pull-down enable signal derived from the pull-down enable signal and generate a signal on the associated pull-down driver line having a second configurable delay with respect to the pull-down enable signal by mixing the pull-down enable signal and the delayed pull-down enable signal.

2. The apparatus of claim 1, wherein each of the pull-up phase mixers is configurable based on a control word and includes a plurality of stages, each stage being responsive to a bit of the associated control word to select one of the pull-up enable signal or the delayed pull-up signal as an output of the stage, and the each pull-up phase mixer is configured to mix the outputs of the stages to generate the signal on the associated pull-up driver line.

3. The apparatus of claim 2, wherein each of the pull-down phase mixers is configurable based on a control word and includes a plurality of stages, each stage being responsive to a bit of the associated control word to select one of the pull-down enable signal or the delayed pull-down signal as an output of the stage, and the each pull-down phase mixer is configured to mix the outputs of the stages to generate the signal on the associated pull-down driver line.

4. The apparatus of claim 1, wherein an output of a first pull-up phase mixer in the plurality of pull-up phase mixers provides the delayed pull-up enable signal for a second pull-up phase mixer in the plurality of pull-up phase mixers and an output of the second pull-up phase mixer provides the delayed pull-up enable signal for the first pull-up phase mixer.

5. The apparatus of claim 1, further comprising:
   at least a first buffer coupled to a pull-up driver line not included in the first subset; and
   first timing adjust circuitry coupled to the plurality of pull-up driver lines and operable to provide a first additional configurable delay on each of the pull-up driver lines, the first additional configurable delay having a resolution less than the first configurable delay.

6. The apparatus of claim 5, further comprising:
   at least a second buffer coupled to a pull-down driver line not included in the second subset; and
   second timing adjust circuitry coupled to the plurality of pull-down driver lines and operable to provide a second additional configurable delay on each of the pull-down driver lines, the second additional configurable delay having a resolution less than the second configurable delay.

7. An apparatus, comprising:
   a plurality of pull-up phase mixers coupled to a first subset of pull-up driver lines, at least one pull-up phase mixer being operable to receive a pull-up enable signal and a delayed pull-up enable signal based, at least in part, on the pull-up enable signal and generate a corresponding pull-up output signal on an associated pull-up driver line;
   a plurality of pull-down phase mixers coupled to a second subset of pull-down driver lines, at least one pull-down phase mixer being operable to receive a pull-down enable signal and a delayed pull-down enable signal based, at least in part, on the pull-down enable signal and generate a corresponding pull-down output signal on an associated pull-down driver line;
   a pull-up driver configured to drive a terminal to a first logic state responsive to receipt of the corresponding pull-up output signal on an associated pull-up driver line; and
   a pull-down driver configured to drive the terminal to a second logic state responsive to receipt of the corresponding pull-down signal on an associated pull-up driver line.

8. The apparatus of claim 7, wherein the at least one pull-up phase mixer is configurable based on a control word and includes a plurality of stages, each stage being responsive to a bit of the associated control word to select one of the pull-up enable signal or the delayed pull-up signal as an output of the stage, and the at least one pull-up phase mixer is configured to mix the outputs of the stages to generate the signal on the associated pull-up driver line.

9. The apparatus of claim 7, wherein the at least one pull-down phase mixer is configurable based on a control word and includes a plurality of stages, each stage being responsive to a bit of the associated control word to select one of the pull-down enable signal or the delayed pull-down signal as an output of the stage, and the at least one pull-down phase mixer is configured to mix the outputs of the stages to generate the signal on the associated pull-down driver line.

10. The apparatus of claim 7, wherein the corresponding pull-up output signal on the associated pull-up driver line is based, at least in part, on mixing the pull-up enable signal and the delayed pull-up enable signal.

11. The apparatus of claim 7, wherein the corresponding pull-down output signal on the associated pull-down driver line is based, at least in part, on mixing the pull-down enable signal and the delayed pull-down enable signal.

12. The apparatus of claim 7, wherein an output of a second pull-up phase mixer provides the delayed pull-up enable signal for the at least one pull-up phase mixer.

13. A method for mixing signals, comprising:
   generating a pull-up enable signal and a pull-down enable signal;
   generating at least one delayed pull-up enable signal and at least one delayed pull-down enable signal;
   mixing the pull-up enable signal and the at least one delayed pull-up enable signal to generate a pull-up drive signal;

mixing the pull-down enable signal and the at least one delayed pull-down enable signal to generate a pull-down drive signal;

driving a terminal to a first logic state based, at least in part, on at least one of the pull-up drive signal and the pull-down drive signal.

14. The method of claim 13, further comprising:
generating a buffered pull-up enable signal based, at least in part, on the pull-up enable signal.

15. The method of claim 13, further comprising:
generating a buffered pull-down enable signal based, at least in part, on the pull-down enable signal.

16. The method of claim 13, wherein the delayed pull-up enable signal is generated by a pull-up phase mixer.

17. The method of claim 13, wherein the delayed pull-down enable signal is generated by a pull-down phase mixer.

18. The method of claim 13, further comprising:
before driving a terminal, adding a configurable delay to at least one of the pull-up drive signal and the pull-down drive signal.

19. The method of claim 13, wherein the pull-up enable signal and pull-down enable signal have the same state.

20. The method of claim 13, further comprising:
generating at least one control word to configure at least one of the pull-up drive signal and the pull-down drive signal.

* * * * *